(12) United States Patent
Furuta et al.

(10) Patent No.: US 10,095,330 B2
(45) Date of Patent: Oct. 9, 2018

(54) PRINTED WIRING BOARD

(71) Applicant: IBIDEN CO., LTD., Ogaki (JP)

(72) Inventors: Toru Furuta, Ogaki (JP); Osamu Futonagane, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 247 days.

(21) Appl. No.: 15/082,407

(22) Filed: Mar. 28, 2016

(65) Prior Publication Data

US 2016/0295691 A1    Oct. 6, 2016

(30) Foreign Application Priority Data

Apr. 1, 2015   (JP) .................................. 2015-075053

(51) Int. Cl.
| | |
|---|---|
| *G06K 9/28* | (2006.01) |
| *G06F 3/041* | (2006.01) |
| *H05K 1/16* | (2006.01) |
| *H05K 3/46* | (2006.01) |
| *H05K 1/02* | (2006.01) |

(52) U.S. Cl.
CPC .............. *G06F 3/041* (2013.01); *H05K 1/16* (2013.01); *H05K 1/162* (2013.01); *H05K 3/4682* (2013.01); *H05K 1/0289* (2013.01); *H05K 1/0298* (2013.01); *H05K 2201/10151* (2013.01)

(58) Field of Classification Search
CPC ................................................... G06K 9/0002
See application file for complete search history.

(56) References Cited

U.S. PATENT DOCUMENTS

| | | | | |
|---|---|---|---|---|
| 9,129,143 | B2* | 9/2015 | Shie ..................... | G06K 9/0002 |
| 9,817,108 | B2* | 11/2017 | Kuo .................... | G01S 7/52017 |
| 2002/0125437 | A1* | 9/2002 | Izumi ..................... | H01L 27/12 |
| | | | | 250/370.01 |
| 2003/0190061 | A1* | 10/2003 | Chou ................... | G06K 9/0002 |
| | | | | 382/124 |
| 2007/0098227 | A1* | 5/2007 | Takahashi ............ | G06K 9/0004 |
| | | | | 382/115 |
| 2013/0265137 | A1* | 10/2013 | Nelson ................ | G06K 9/0002 |
| | | | | 340/5.82 |
| 2017/0330016 | A1* | 11/2017 | Benkley, III ....... | G06K 9/00033 |

FOREIGN PATENT DOCUMENTS

JP             2001-056204 A        2/2001

* cited by examiner

*Primary Examiner* — Brian Werner
(74) *Attorney, Agent, or Firm* — Oblon, McClelland, Maier & Neustadt, L.L.P.

(57) ABSTRACT

A printed wiring board includes a first insulating layer, a first conductor circuit including fingerprint authentication circuitry and embedded in the first insulating layer such that the first circuit has exposed surface exposed from surface of the first insulating layer, a second insulating layer on which the first insulating layer is formed, a second conductor circuit including fingerprint authentication circuitry and embedded in the second insulating layer such that the second circuit has exposed surface exposed from surface of the second insulating layer and is interposed between the first and second insulating layers, and a solder resist layer formed on the surface of the first insulating layer and covering the first circuit. The first and second circuits are positioned such that the first and second circuits are opposing each other across the first insulating layer and that a finger for fingerprint authentication is placed on the solder resist layer.

20 Claims, 4 Drawing Sheets

PRINTED WIRING BOARD

CROSS-REFERENCE TO RELATED APPLICATIONS

The present application is based upon and claims the benefit of priority to Japanese Patent Application No. 2015-075053, filed Apr. 1, 2015, the entire contents of which are incorporated herein by reference.

BACKGROUND OF THE INVENTION

Field of the Invention

The present invention relates to a printed wiring board that has a conductor circuit for fingerprint authentication.

Description of Background Art

Japanese Patent Laid-Open Publication No. 2001-56204 describes a capacitance type fingerprint sensor. In Japanese Patent Laid-Open Publication No. 2001-56204, the capacitance type fingerprint sensor includes a semiconductor chip, a die pad, a package member, a wire, and a ground electrode. The semiconductor chip of Japanese Patent Laid-Open Publication No. 2001-56204 has a cell for detecting a capacitance. In Japanese Patent Laid-Open Publication No. 2001-56204, the cell has an electrode on an insulating layer, and the electrode is covered by a protective film. The entire contents of this publication are incorporated herein by reference.

SUMMARY OF THE INVENTION

According to one aspect of the present invention, a printed wiring board includes a first insulating layer, a first conductor circuit including fingerprint authentication circuitry and embedded in the first insulating layer such that the first conductor circuit has an exposed surface exposed from a surface of the first insulating layer, a second insulating layer on which the first insulating layer is formed, a second conductor circuit including fingerprint authentication circuitry and embedded in the second insulating layer such that the second conductor circuit has an exposed surface exposed from a surface of the second insulating layer and is interposed between the first insulating layer and the second insulating layer, and a solder resist layer formed on the surface of the first insulating layer such that the solder resist layer is covering the first conductor circuit. The first conductor circuit and the second conductor circuit are positioned such that the first conductor circuit and the second conductor circuit are opposing each other across the first insulating layer and that a finger for fingerprint authentication is placed on the solder resist layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
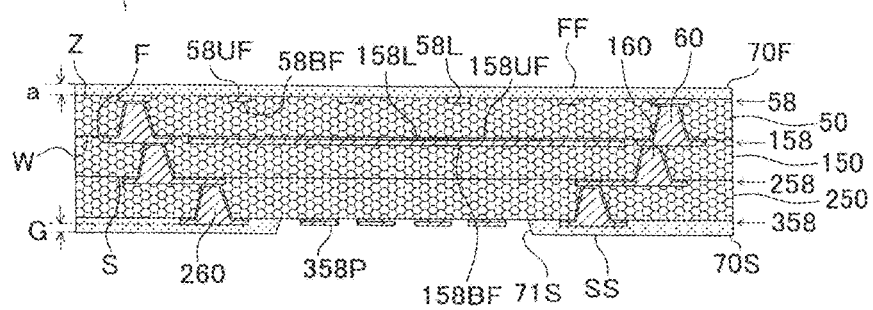
FIG. 1A is a cross-sectional view of a printed wiring board according to an embodiment of the present invention.

The embodiments will now be described with reference to the accompanying drawings, wherein like reference numerals designate corresponding or identical elements throughout the various drawings.

Embodiment

A cross section of a printed wiring board 10 according to an embodiment of the present invention is illustrated in FIG. 1A.

The printed wiring board 10 of the embodiment is a printed wiring board that includes conductor circuits (58L, 158L) for fingerprint authentication. The printed wiring board 10 includes: a second insulating layer (second resin insulating layer) 150 that has a third surface (F) and a fourth surface (S) that is on an opposite side of the third surface (F); a second conductor layer 158 that is formed on the third surface (F) of the second insulating layer 150; a first insulating layer (first resin insulating layer) 50 that has a first surface (Z) and a second surface (W) that is on an opposite side of the first surface (Z), and is formed on the second conductor layer 158 and on the third surface (F) of the second insulating layer 150; a first conductor layer 58 that is formed on the first surface (Z) of the first insulating layer; and an upper side solder resist layer (70F) that is formed on first surface (Z) of the first insulating layer and on the first conductor layer 58. The second surface (W) of the first insulating layer and the third surface (F) of the second insulating layer oppose each other. The first conductor circuit (58L) for fingerprint authentication is contained in the first conductor layer 58. The second conductor circuit (158L) for fingerprint authentication is contained in the second conductor layer 158. The second conductor layer 158 is sandwiched between the second surface (W) of the first insulating layer 50 and the third surface (F) of the second insulating layer 150, and thus is formed on the second surface (W) of the first insulating layer 50. The first conductor circuit (58L) for fingerprint authentication and the second conductor circuit (158L) for fingerprint authentication oppose each other across the first insulating layer 50.

As illustrated in FIG. 1A, the printed wiring board 10 may further include a lower side solder resist layer (70S) on the fourth surface (S) of the second insulating layer. The printed wiring board 10 may also have, between the lower side solder resist layer (70S) and the fourth surface (S) of the second insulating layer 150, a third conductor layer 258 that is formed on the fourth surface (S), a third insulating layer (third resin insulating layer) 250 that is formed on the second insulating layer 150 and on the third conductor layer 258, and a fourth conductor layer 358 that is formed on the third insulating layer. In FIG. 1A, the lower side solder resist layer (70S) is formed on the third insulating layer 250 and on the fourth conductor layer 358. A lowermost conductor layer that is formed immediately below the lower side solder resist layer (70S) has a pad (358P) for mounting an electronic component. In FIG. 1A, the fourth conductor layer 358 is the lowermost conductor layer.

As illustrated in FIG. 1A, an upper surface (FF) of the upper side solder resist layer (70F) and an upper surface (SS) of the lower side solder resist layer (70S) are exposed to outside. The upper surface (FF) of the upper side solder resist layer (70F) is an uppermost surface of the printed wiring board, and the upper surface (SS) of the lower side solder resist layer (70S) is a lowermost surface of the printed wiring board. The uppermost surface (FF) of the printed wiring board 10 is positioned on the first surface (Z) of the first insulating layer 50, and the lowermost surface (SS) of the printed wiring board 10 is positioned on the second surface (W). In FIG. 1A, the upper side solder resist layer (70F) covers the first insulating layer 50 and the first conductor layer 58.

The adjacent conductor layers (58, 158, 258, 358) are connected by via conductors (60, 160, 260) that respectively penetrate the insulating layers (50, 150, 250) that are each sandwiched by adjacent conductor layers.

Figure 2A:
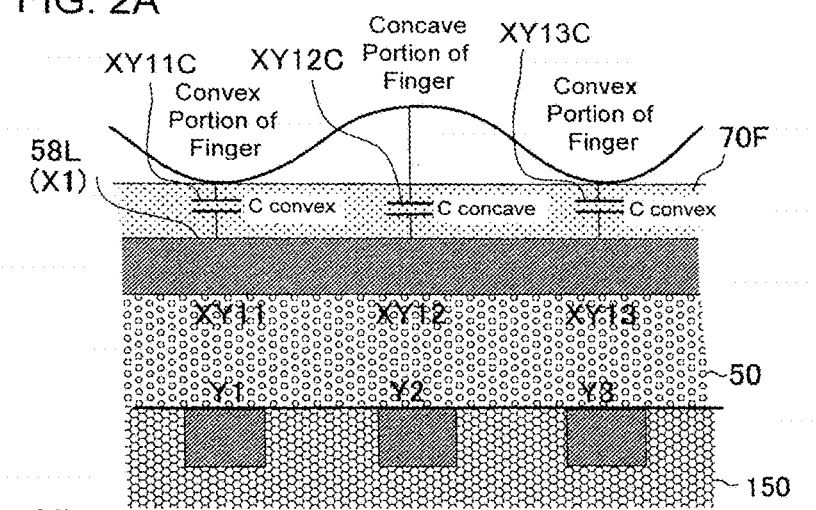
FIG. 2A schematically illustrates a capacitance accumulated between a first conductor circuit and a finger.

A finger is placed on the upper side solder resist layer (70F) of the printed wiring board 10. As illustrated in FIG. 2A, a capacitor is formed by the finger, the first conductor circuit (58L) for fingerprint authentication, and a dielectric material (the upper side solder resist layer) between the finger and the first conductor circuit (58L). The finger and the first conductor circuit (58L) are electrodes. A distance between the finger and the first conductor circuit (58L) is an inter-electrode distance. A capacitance of the capacitor depends on the inter-electrode distance. The finger is placed on the upper side solder resist layer (70F). Therefore, flatness of the upper surface (FF) of the upper side solder resist layer (70F) relates to the inter-electrode distance. In order to increase fingerprint authentication accuracy, it is preferable that the flatness of the upper surface (FF) be high.

Figure 1B:
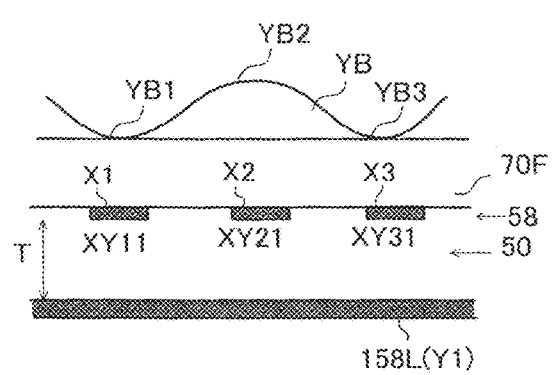
FIGS. 1B, 1C and 1D are diagrams for describing a first example for authenticating a fingerprint.
Figure 1C:
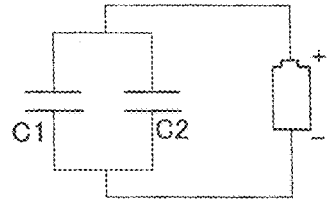
Figure 1D:
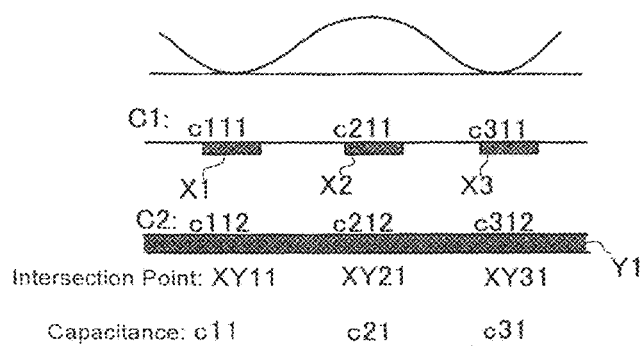
Figure 1E:
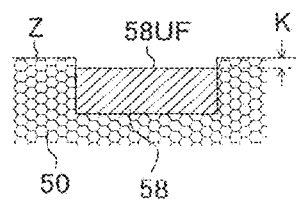
FIG. 1E is an enlarged view of a first conductor circuit for fingerprint authentication.

The first conductor layer 58 has a top surface (58UF) (top surface of the first conductor layer) and a bottom surface (58BF) (bottom surface of the first conductor layer) that is on an opposite side of the top surface (58UF). The first conductor circuit (58L) for fingerprint authentication has a top surface (58UF) (top surface of the first conductor circuit) and a bottom surface (58BF) (bottom surface of the first conductor circuit) that is on an opposite side of the top surface (58UF). The top surface (58UF) (the top surface of the first conductor layer, the top surface of the first conductor circuit) faces the first surface (Z) of the first insulating layer 50. The first conductor layer 58 and the first conductor circuit (58L) for fingerprint authentication are embedded in the first insulating layer 50. However, the top surface (58UF) is exposed from the first surface (Z). In the printed wiring board 10, the conductor layer (the first conductor layer 58) that is covered by the upper side solder resist layer (70F) does not protrude on the first surface (Z) of the first insulating layer. The first conductor layer 58 is embedded in the first resin insulating layer 50. Therefore, the top surface (58UF) and the first surface (Z) are positioned on the same plane. Or, a height difference between the top surface (58UF) and the first surface (Z) is small. Unevenness of the surface on which the upper side solder resist layer (70F) is formed is reduced. The upper side solder resist layer 70 can be formed on a substantially flat surface. Therefore, the flatness of the upper surface (FF) of the upper side solder resist layer is increased. FIG. 1E illustrates the top surface (58UF) and the first surface (Z). The top surface (58UF) may be recessed from the first surface (Z). A distance (K) between the top surface (58UF) and the first surface (Z) is illustrated in FIG. 1E. When the distance (K) is 4 µm or less, a maximum height (Rmax) of the upper surface (FF) is reduced. For example, the maximum height (Rmax) is 4 µm or less. Therefore, accuracy of fingerprint authentication is increased. When the distance (K) is 0, the top surface (58UF) and the first surface (Z) are formed on a common plane. In this case, the upper side solder resist layer (70F) is formed on a flat surface and thus the flatness of the upper surface (FF) is increased. Repeat accuracy of fingerprint authentication can be increased.

The second insulating layer 150 and the second conductor layer 158 support the first insulating layer 50. The second insulating layer 150 and the second conductor layer 158 are in contact with the second surface (W) of the first insulating layer 50. Therefore, the second insulating layer 150 and the second conductor layer 158 are likely to affect the flatness of the upper surface (FF).

The second conductor layer 158 has a top surface (158UF) (top surface of the second conductor layer) and a bottom surface (158BF) (bottom surface of the second conductor layer) that is on an opposite side of the top surface (158UF). The second conductor circuit (158L) for fingerprint authentication has a top surface (158UF) (top surface of the second conductor circuit) and a bottom surface (158BF) (bottom surface of the second conductor circuit) that is on an opposite side of the top surface (158UF). The top surface (158UF) (the top surface of the second conductor layer, the top surface of the second conductor circuit) faces the third surface (F) of the second insulating layer 150. The second conductor layer 158 and the second conductor circuit (158L) for fingerprint authentication are embedded in the second insulating layer 150. However, the top surface (158UF) is exposed from the third surface (F). In the printed wiring board 10, the second conductor layer 158 that is covered by the first insulating layer 50 does not protrude on the third surface (F) of the second insulating layer. The second conductor layer 158 is embedded in the second resin insulating layer 150. The top surface (158UF) and the third surface (F) are positioned on the same plane. Unevenness of the surface on which the first insulating layer 50 is formed is reduced. The first insulating layer 50 can be formed on a substantially flat surface. Since the first insulating layer 50 is formed on a plat surface, the flatness of the upper surface (FF) is increased. Repeat accuracy of fingerprint authentication can be increased.

The upper side solder resist layer (70F) does not have an opening. The first insulating layer (uppermost resin insulating layer) 50 and the first conductor layer 58 are completely covered by the upper side solder resist layer (70F). The maximum height (Rmax) of the upper surface (FF) of the upper side solder resist layer (70F) is 4 µm or less. As a result, a concave-convex pattern of a fingerprint can be measured with accuracy. Measurement of a fingerprint or authentication of a fingerprint is performed, for example, by measuring a capacitance. The maximum height (Rmax) of the upper surface (FF) of the upper side solder resist layer that is formed on the first conductor circuit for fingerprint authentication is 4 µm or less. The maximum height (Rmax) of the upper surface (FF) of the upper side solder resist layer in other areas may exceed 4 µm. A length that measures the maximum height (Rmax) is 1 mm.

The lower side solder resist layer (70S) has an opening (71S) for exposing the fourth conductor layer 358 that has the pad (358P) for mounting an electronic component. The electronic component is mounted on the printed wiring board via the pad (358P). An application example is completed. An example of the electronic component is a semiconductor element for fingerprint authentication.

A first example for authenticating a fingerprint is illustrated below.

Figure 2B:
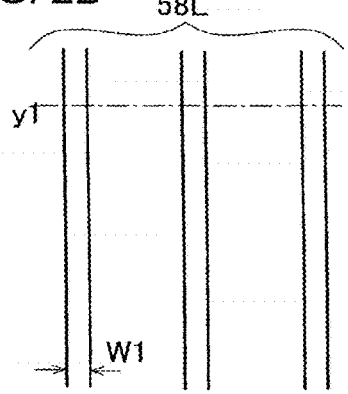
FIGS. 2B, 2C and 2D are plan views schematically illustrating conductor circuits for fingerprint authentication.
Figure 2C:
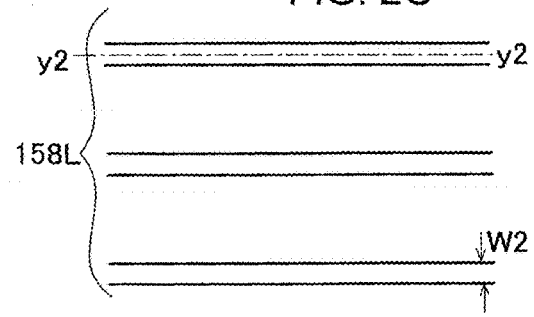
Figure 2D:
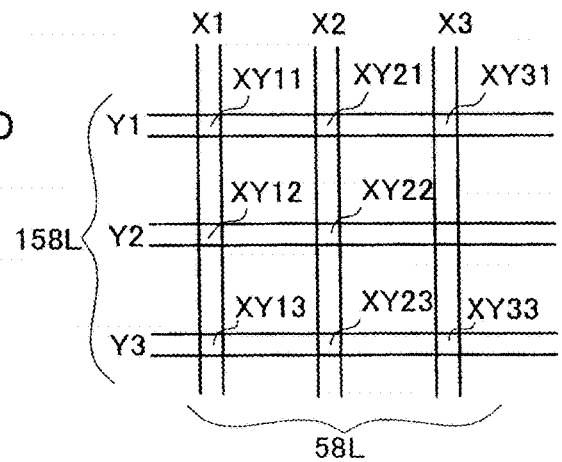

FIG. 2B illustrates a plan view of the first conductor circuit (58L) for fingerprint authentication that is formed on the first surface (Z) of the insulating layer (uppermost resin insulating layer, first insulating layer) 50. FIG. 2C illustrates a plan view of the second conductor circuit (158L) for fingerprint authentication that is formed on the second surface (W) of the insulating layer (uppermost resin insulating layer) 50. FIGS. 2B and 2C are schematic diagrams. A number of first conductor circuits (58L) illustrated in FIG. 2B is different from a number of first conductor circuits (58L) that are formed in the printed wiring board 10. A number of second conductor circuits (158L) illustrated in FIG. 2C is different from a number of second conductor circuits (158L) that are formed in the printed wiring board 10. The insulating layer (uppermost resin insulating layer, first insulating layer) 50 is sandwiched by the first conductor circuit (58L) for fingerprint authentication and the second conductor circuit (158L) for fingerprint authentication. FIG. 2D illustrates a view that is obtained by observing, from the upper surface (FF), the first conductor circuit (58L) for fingerprint authentication, the second conductor circuit (158L) for fingerprint authentication and the insulating layer (uppermost resin insulating layer) 50. In FIG. 2D, X wirings (X1, X2, X3) and Y wirings (Y1, Y2, Y3) are superimposed. An X axis and a Y axis are illustrated on a right side in FIG. 2D. In FIG. 2D, the first conductor circuits (58L) for fingerprint authentication are formed parallel to the X axis. The first conductor circuits (58L) for fingerprint authentication are referred to as the X wirings. The second conductor circuits (158L) for fingerprint authentication are formed parallel to the Y axis. The second conductor circuits (158L) for fingerprint authentication are referred to as the Y wirings. In FIG. 2D, the first conductor circuits (58L) for fingerprint authentication and the second conductor circuits (158L) for fingerprint authentication are orthogonal to each other. The two may also obliquely intersect. Widths (W1) of the X wirings are substantially equal. Widths (W2) of the Y wirings are substantially equal. The insulating layer 50 has a substantially uniform thickness (T). The thickness (T) is illustrated in FIG. 1B and is a distance between the X wirings and the Y wirings.

In FIGS. 2B, 2C and 2D, three X wirings and three Y wirings are illustrated. In FIG. 2D, a left X wiring is an X1 wiring, a middle X wiring is an X2 wiring, and a right X wiring is an X3 wiring. In FIG. 2D, an upper Y wiring is a Y1 wiring, a middle Y wiring is a Y2 wiring, and a lower Y wiring is a Y3 wiring.

As illustrated in FIGS. 1A and 2D, the X wirings and the Y wirings oppose each other at multiple places. A portion where an X wiring and a Y wiring oppose each other is referred to as an intersection point. At an intersection point, the insulating layer (uppermost resin insulating layer) 50 exists between the X wiring and the Y wiring. Since the first insulating layer 50 is formed of a dielectric material, when a voltage is applied between the X wiring and the Y wiring, the intersection point has a function of a capacitor. Therefore, electric charge is accumulated at the intersection point.

For example, when a voltage is applied between the X1 wiring and the Y1 wiring, electric charge is accumulated at an intersection point (XY11) illustrated in FIG. 2D. For example, when a voltage is applied between the X3 wiring and the Y3 wiring, electric charge is accumulated at an intersection point (XY33) illustrated in FIG. 2D.

For example, the Y wirings (the Y1 wiring, the Y2 wiring and the Y3 wiring) are connected to the ground, and the X wirings (the X1 wiring, the X2 wiring and the X3 wiring) are connected to a predetermined positive electric potential. Capacitances of the capacitors that are formed at the intersection points are substantially equal to each other. Substantially the same amount of electric charge is accumulated at each of the intersection point.

As illustrated in FIG. 1B, a finger (YB) is placed on the upper side solder resist layer (70F) that is positioned on the first conductor circuit (58L) for fingerprint authentication. In FIG. 1B, the printed wiring board 10 is cut such that the Y1 wiring is included. In FIG. 1B, the Y1 wiring, the insulating layer 50, the X1 wiring, the X2 wiring, the X3 wiring, the upper side solder resist layer (70F) and the finger (YB) are illustrated. The intersection points (XY11, XY21, XY31) are illustrated below the X wirings (X1, X2, X3) in FIG. 1B. Since a fingerprint has concave and convex portions, convex portions (YB1, YB3) of the fingerprint are in contact with the upper side solder resist layer (70F), and a concave portion (YB2) of the fingerprint is not in contact with the upper side solder resist layer (70F). The finger touches the upper side solder resist layer positioned on the intersection points (XY11) and the intersection point (XY31) illustrated in FIG. 2D. In contrast, the finger does not touch the upper side solder resist layer positioned on the intersection point (XY21) illustrated in FIG. 2D. For example, the finger and the second conductor circuit (158L) for fingerprint authentication are connected to the ground. The Y1 wiring is connected to the ground. The first conductor circuit (58L) for fingerprint authentication is connected to a predetermined positive electric potential. The X1 wiring, the X2 wiring and the X3 wiring are connected to a predetermined positive electric potential. Therefore, at the intersection point (XY11), a capacitor (C1) is formed by the finger (YB) and the X1 wiring, and a capacitor (C2) is formed by the X1 wiring and the Y1 wiring. Electrodes of the capacitor (C1) are the finger and the first conductor circuit (58L), and a dielectric material of the capacitor (C1) includes the upper side solder resist layer (70F). Electrodes of the capacitor (C2) are the first conductor circuit (58L) and the second conductor circuit (158L), and a dielectric material of the capacitor (C2) is the first insulating layer 50. In this case, the capacitor (C1) and the capacitor (C2) are connected in parallel as illustrated in FIG. 1C. Therefore, a capacitance (c11) at the intersection point (XY11) is a sum of a capacitance (c111) of the capacitor (C1) and a capacitance (c112) of the capacitor (C2). Similarly, a capacitance (c21) at the intersection point (XY21) is a sum of a capacitance (c211) of the capacitor (C1) and a capacitance (c212) of the capacitor (C2). Similarly, a capacitance (c31) at the intersection point (XY31) is a sum of a capacitance (c311) of the capacitor (C1) and a capacitance (c312) of the capacitor (C2). These are illustrated in FIG. 1D. In this case, the finger does not touch the upper side solder resist layer (70F) on the intersection point (XY21). Therefore, the capacitance (c211) has a value close to zero. In contrast, the finger touches the upper side solder resist layer (70F) on the intersection point (XY11). Therefore, the capacitance (c111) has a predetermined value. The finger touches the upper side solder resist layer (70F) on the intersection point (XY31). Therefore, the capacitance (c311) has a predetermined value. As described above, the capacitance (c112), the capacitance (c212) and the capacitance (c312) are substantially equal to each other. Therefore, the values of the capacitance (c11) and the capacitance (c31) are larger than the value of the capacitance (c21). For example, a threshold (Ct) exists between the capacitance (c11) and the capacitance (c21). Then, an intersection point having a capacitance larger than the threshold (Ct) is determined as 1, and an intersection point having a capacitance smaller than the threshold (Ct) is determined as 0. Each of the intersection points is determined as either 1 or 0. When an intersection point is determined as 1, the fingerprint positioned on the intersection point is a convex portion. When an intersection point is determined as 0, the fingerprint positioned on the intersection point is a concave portion. Therefore, by connecting intersection points that are determined as 1, a shape of the convex portion of the fingerprint can be formed. By connecting intersection points that are determined as 0, a shape of the concave portion of the fingerprint can be formed. According to the first example, the fingerprint can be recognized. A whole picture of the fingerprint can be measured.

When the convex portion of the fingerprint is surely in contact with the upper side solder resist layer (70F) and the concave portion of the fingerprint is surely away from the upper side solder resist layer (70F), the accuracy of the fingerprint authentication is high.

The width (W2) of the second conductor circuit (158L) for fingerprint authentication is larger than the width (W1) of the first conductor circuit (58L) for fingerprint authentication. Since spacing between the second conductor circuits (158L) is reduced, the flatness of the upper surface of the insulating layer 50 on the second conductor circuits (158L) is increased. Therefore, the flatness of the upper surface (FF) of the upper side solder resist layer is increased. A ratio (width (W2)/width (W1)) between the width (W2) of the second conductor circuit (158L) and the width (W1) of the first conductor circuit (58L) is 1.2 or more and 2 or less.

The capacitance of the capacitor (C1) changes depending on presence of absence of touch by the finger. Therefore, when the capacitance of the capacitor (C1) is large and the capacitance of the capacitor (C2) is small, the accuracy of the determination of 0 or 1 is increased. The accuracy of fingerprint authentication is increased. In order to increase the capacitance of the capacitor (C1), it is preferable that a permittivity (E1)) of the upper side solder resist layer (70F) be high. It is preferable that the permittivity (E1) be greater than 5. Noise is reduced. When the permittivity (E1) is 10 or more, the accuracy of fingerprint authentication is increased. When the permittivity (E1) is 30 or more, the repeat accuracy is increased. Measuring time is shortened.

In order to decrease the capacitance of the capacitor (C2), it is preferable that a permittivity (E2) of the first insulating layer 50 be low. It is preferable that the permittivity (E2) be 4.5 or less. Noise is reduced. When the permittivity (E2) is 4 or less, the accuracy of fingerprint authentication is increased. When the permittivity (E2) is 3 or less, the repeat accuracy is increased. The measuring time is shortened.

The permittivity (E1) of the upper side solder resist layer is greater than the permittivity (E2) of the first insulating layer 50. When a ratio (permittivity (E1)/permittivity (E2)) between the permittivity (E1) and the permittivity (E2) is 1.5 or more, noise is reduced. When the ratio (permittivity (E1)/permittivity (E2)) between the permittivity (E1) and the permittivity (E2) is 2 or more, the accuracy of fingerprint authentication is increased. When the ratio (permittivity (E1)/permittivity (E2)) is 3 or more, the repeat accuracy is increased. The measuring time is shortened.

Second Example for Authenticating Fingerprint

The first conductor circuit (58L) for fingerprint authentication and the second conductor circuit (158L) for fingerprint authentication of a second example are the same as the first example.

A plan view of the first conductor circuit (58L) of the second example is illustrated in FIG. 2B. A cross section between y1 and y1 in FIG. 2B is illustrated in FIG. 1A.

A plan view of the second conductor circuit (158L) is illustrated in FIG. 2C. A cross section between y2 and y2 in FIG. 2C is illustrated in FIG. 1A. In the second example, a voltage is applied to the first conductor circuit (58L). The first conductor circuit (58L) is used as a conductor circuit for accumulating electric charge that corresponds to a capacitance between the first conductor circuit (58L) and the finger. The second conductor circuit (158L) is used as a conductor circuit for detecting the electric charge accumulated in the first conductor circuit (58L) as a voltage.

In FIG. 2D, the X wirings (X1, X2, X3) and the Y wirings (Y1, Y2, Y3) are superimposed. For example, a pulsed voltage is applied between the X1 wiring and the ground (not illustrated in the drawings). A capacitor is formed by the X1 wiring, the finger, and a dielectric material between the two. As illustrated in FIG. 2A, at the intersection point (XY11) of the Y1 wiring for measurement and the X1 wiring, a capacitor (XY11C) is formed by the finger (electrode), the X1 wiring (electrode), and the upper side solder resist layer (dielectric material) (70F) between the finger and the X1 wiring. At the intersection point (XY12), a capacitor (XY12C) is formed by the finger (electrode), the X1 wiring (electrode), and a dielectric material that includes the upper side solder resist layer (70F) and air between the finger and the X1 wiring. At the intersection point (XY13), a capacitor (XY13C) is formed by the finger (electrode), the X1 wiring (electrode), and the upper side solder resist layer (dielectric material) (70F) between the finger and the X1 wiring. Capacitances of the capacitors (XY11C, XY12C, XY13C) are measured. The capacitor (XY11C) has a capacitance ($C_{convex}$). Corresponding to the capacitance ($C_{convex}$), electric charge is accumulated in the X1 wiring at the intersection point (XY11). A voltage corresponding to the electric charge accumulated in the X1 wiring at the intersection point (XY11) is detected using the Y1 wiring that is capacitively coupled via the insulating layer 50. Using the same method, a voltage corresponding to the electric charge accumulated in the X1 wiring at the intersection point (XY12) is detected using the Y2 wiring that is capacitively coupled via the insulating layer 50. The capacitance of the capacitor (XY12C) is a capacitance ($C_{concave}$). A voltage corresponding to the electric charge accumulated in the X1 wiring at the intersection point (XY13) is detected using the Y3 wiring that is capacitively coupled via the insulating layer 50. The capacitance of the capacitor (XY13C) is a capacitance ($C_{convex}$). When the measurement of the voltages corresponding to the electric charges accumulated in the X1 wiring at the intersection points is completed, in order to discharge the electric charges in the X1 wiring, the X1 wiring is connected to the ground. Thereafter, using the same method, voltages corresponding to the electric charges accumulated in the X wirings at the intersection points are measured using the Y wirings.

FIG. 2A is a schematic diagram illustrating capacitances of the capacitors (XY11C, XY12C, XY13C) that are formed between the first conductor circuit (58L) and the finger. A capacitance of a capacitor is expressed by $C = \varepsilon(s/d)$, where a is a permittivity ($\varepsilon$) of a dielectric material, s is an area (s) of an electrode, and d is a distance (d) between electrodes. Therefore, the capacitance (C) changes depending on the distance (d). The finger forms an electrode of a capacitor. The distance (d) at a convex portion of a fingerprint is smaller than the distance (d) at a concave portion of the fingerprint. Due to the concave-convex pattern of the fingerprint, the capacitances of the capacitors (XY11C, XY12C, XY13C) are different from each other. Further, electric charge Q accumulated on an electrode of a capacitor is expressed by Q=CV, where V is a voltage. The voltage (V) is a voltage between the X wirings and the finger. The voltage (V) is applied via the X wirings, and has a certain value. Therefore, electric charges (Q) accumulated in the capacitors (XY11C XY12C, XY13C) at the intersection points depend on the capacitances (C) of the capacitors (XY11C, XY12C, XY13C) at the intersection points. That is, the electric charges accumulated in the capacitors that are formed between the first conductor circuits (58L) (X wirings) of the printed wiring board and the finger are different from each other due to the concave-convex pattern of the fingerprint. In the second example, fingerprint recognition is performed by detecting the differences. The distance (d) at a convex portion of the fingerprint is smaller than the distance (d) at a concave portion of the fingerprint. Therefore, the capacitances ($C_{convex}$) of the capacitors (XY11C, XY13C) at the intersection points (XY11, XY13) are larger than the capacitance ($C_{concave}$) of the capacitor (XY12C) at the intersection point (XY12). Therefore, electric charge accumulated in an X wiring that opposes a convex portion of a fingerprint across a dielectric material is larger than electric charge accumulated in the X wiring that opposes a concave portion of the fingerprint across the dielectric material. Voltages corresponding to the electric charges that depend on the concave-convex pattern of the fingerprint are detected using the Y wirings that are capacitively coupled to the X wirings. Therefore, according to the second example, a concave-convex pattern of a fingerprint can be measured. The concave-convex pattern of the fingerprint can be recognized. A whole picture of the fingerprint can be measured.

The dielectric material that is formed between the first conductor circuits (X wirings) (58L) and the finger is the upper side solder resist layer (70F). Therefore, by increasing the permittivity of the upper side solder resist layer (70F), the difference between the capacitance ($C_{convex}$) and the capacitance ($C_{concave}$) can be increased. The upper side solder resist layer of the second example and the upper side solder resist layer of the first example are the same. As a result, recognition performance of fingerprint authentication can be improved.

Method for Manufacturing Printed Wiring Board of Embodiment

A method for manufacturing the printed wiring board 10 of the embodiment is illustrated in FIGS. 3A-3E and 4A-4D.

Figure 3A:
FIG. 3A-3E illustrate manufacturing process diagrams of the printed wiring board of the embodiment.
Figure 3B:
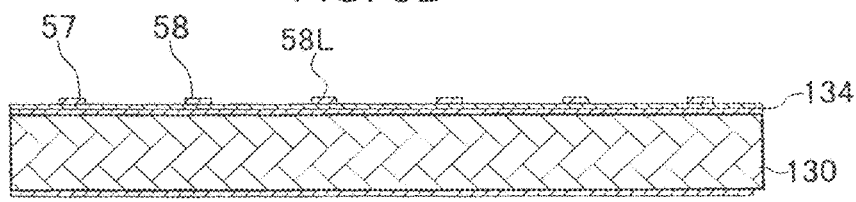

A support plate 130 is prepared. A copper foil 134 is laminated on the support plate 130 (FIG. 3A). An example of the support plate is a double-sided copper-clad laminated plate. A plating resist is formed on the copper foil 134. An electrolytic copper plating film 57 is formed by electrolytic copper plating on the copper foil 134 that is exposed from the plating resist. The plating resist is removed. The first conductor layer 58 is formed from the electrolytic copper plating film 57. The first conductor layer 58 includes the first conductor circuit (58L) for fingerprint authentication.

Figure 3C:
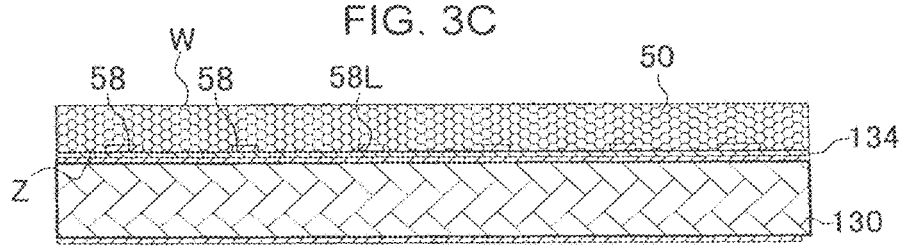
Figure 3D:
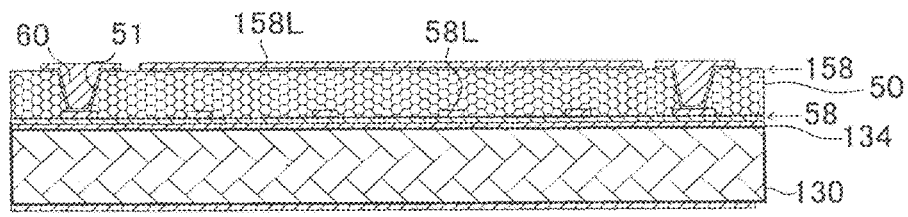

The first insulating layer 50 having the first surface (Z) and the second surface (W) is formed on the first conductor layer 58 and the copper foil 134. The first surface (Z) opposes the copper foil 134. As illustrated in FIG. 3C, the first conductor layer 58 is embedded in the first insulating layer 50 on the first surface (Z) side. An opening 51 for a via conductor 60 that reaches the first conductor layer 58 is formed in the first insulating layer 50. Thereafter, using a semi-additive method, the second conductor layer 158 including the second conductor circuit (158L) for fingerprint authentication is formed on the second surface (W) (FIG. 3D). In this case, the via conductor 60 that connects the first conductor layer 58 and the second conductor layer 158 is formed in the opening 51.

Figure 3E:
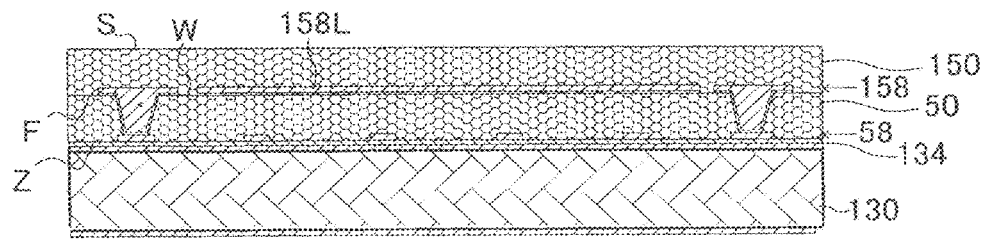

The second insulating layer 150 having the third surface (F) and the fourth surface (S) is formed on the second surface (W) of the first insulating layer 50 and on the second conductor layer 158 (FIG. 3E). The third surface (F) opposes the second surface (W). As illustrated in FIG. 3E, the second conductor layer 158 is embedded in the second insulating layer 150 on the third surface (F) side. An opening 151 for a via conductor 160 that reaches the second conductor layer 158 is formed in the second insulating layer 150. Thereafter, using a semi-additive method, the third conductor layer 258 is formed on the fourth surface (S). In this case, the via conductor 160 that connects the second conductor layer 158 and the third conductor layer 258 is formed in the opening 151.

Figure 4A:
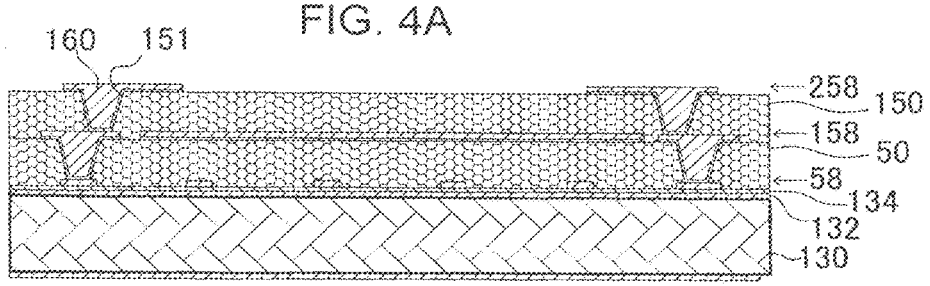
FIG. 4A-4D illustrate manufacturing process diagrams of the printed wiring board of the embodiment.
Figure 4B:
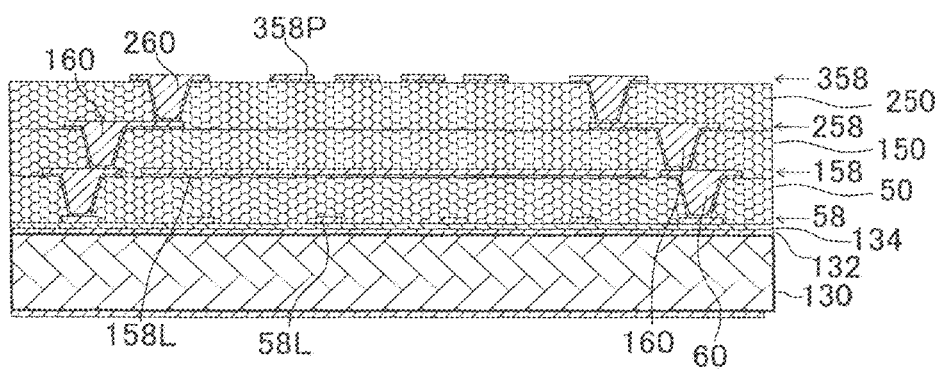

The methods illustrated in FIGS. 3E and 4A are repeated. The third insulating layer (third resin insulating layer) 250 and the fourth conductor layer 358 are formed on the fourth surface (S) of the second insulating layer. The via conductor 260 that connects the third conductor layer 258 and the fourth conductor layer 358 is formed in the third insulating layer (FIG. 4B). The fourth conductor layer 358 includes the pad (358P). The via conductor 260 penetrates the third insulating layer and connects the third conductor layer and the fourth conductor layer.

Figure 4C:
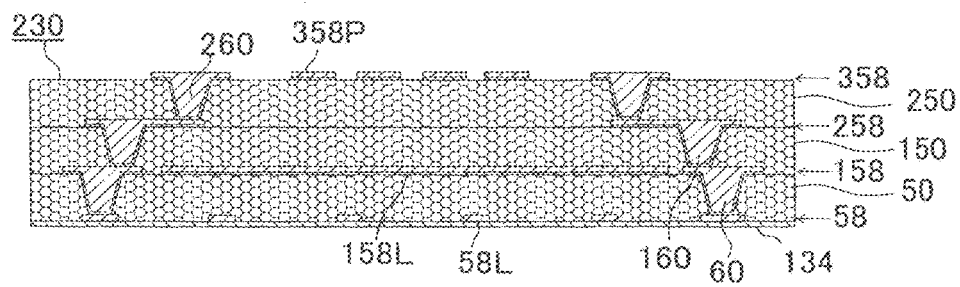
Figure 4D:
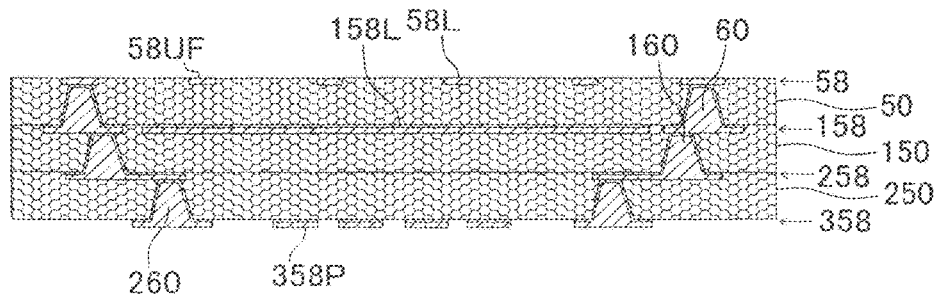

The support plate 130 and the copper foil 134 are separated from each other, and a halfway substrate 230 is obtained (FIG. 4C). The copper foil 134 is removed from the halfway substrate 230 (FIG. 4D). The top surface (58UF) of the first conductor layer 58 is exposed. Further, the thickness of the first conductor layer 58 can be reduced by etching or the like. The top surface (58UF) of the first conductor layer 58 is recessed from the first surface (Z). The distance (K) can be adjusted by controlling etching time or the like.

The upper side solder resist layer (70F) is formed on the first insulating layer 50 and on the first conductor layer 58. The upper side solder resist layer (70F) completely covers the first insulating layer 50 and the first conductor layer 58. The upper side solder resist layer (70F) does not have an opening that exposes the first conductor layer.

The lower side solder resist layer (70S) that has the opening (71S) for exposing the pad (358P) is formed on the third insulating layer 250 and on the fourth conductor layer 358 (FIG. 1A). A protective film (not illustrated in the drawings) is formed on the pad (358P). Oxidation of the pad (358P) is prevented by the protective film. An example of the protective film is Ni/Au. The printed wiring board 10 is completed.

In order to increase the flatness of the upper side solder resist layer (70F), it is preferable that the upper side solder resist layer (70F) have a thickness (a) of 3-10 μm. In the embodiment, the upper side solder resist layer is formed on a substantially flat surface. Therefore, the thickness (a) can be reduced. Capacitance can be increased. For example, it is preferable that the thickness (a) be 8 μm or less. The thickness (a) is a distance between the upper surface (FF) of the upper side solder resist layer and the first surface (Z) of the first insulating layer 50. Further, it is preferable that the first conductor layer 58 and the second conductor layer 158 each have a thickness of 5 μm or more and 10 μm or less. The flatness of the upper surface (FF) is increased. A time period required for fingerprint authentication is shortened.

The insulating layers (50, 150, 250) are each formed of a resin, a reinforcing material, and inorganic particles. Examples of the reinforcing material include a glass cloth, aramid fiber, and glass fiber. Examples of the resin include an epoxy resin and a BT (bismaleimide triazine) resin. Examples of the inorganic particles include silica and alumina particles.

Since the upper side solder resist layer (70F) does not have an opening, the upper side solder resist layer (70F) of the printed wiring board of the embodiment is formed of a thermosetting resin. The flatness of the upper surface (FF) is increased. Since the lower side solder resist layer has an opening, the lower side solder resist layer (70S) of the embodiment is formed of a photocurable resin.

The upper side solder resist layer (70F) does not have an opening. The lower side solder resist layer (70S) has an opening. Or, the thickness (a) of the upper side solder resist layer (70F) and a thickness (G) of the lower side solder resist layer (70S) are different from each other. In order to reduce an influence due to a difference in material, thickness, or volume, it is preferable that a ratio (a/G) between the thickness (G) of the lower side solder resist layer (70S) and the thickness (a) of the upper side solder resist layer (70F) be greater than 0.7 and less than 1.2. The thickness (G) is a distance between the upper surface (SS) of the lower side solder resist layer and the fourth conductor layer 358.

It is preferable that a permittivity (E3) of the lower side solder resist layer (70S) of the printed wiring board of the embodiment be lower than the permittivity (E1) of the upper side solder resist layer (70F). Data transmitted via a conductor circuit contained in a lowermost conductor layer (fourth conductor layer) (358S) is unlikely to deteriorate. Signal delay is unlikely to occur.

It is preferable that the permittivity (E3) of the lower side solder resist layer (70S) of the printed wiring board of the embodiment be higher than the permittivity (E2) of the first insulating layer 50. When a permittivity is low, a glass transition temperature (Tg) is likely to be low. Since an electronic component is mounted on the pad (358P) that is exposed from the lower side solder resist layer (70S), temperature of the lower side solder resist layer (70S) is likely to be high. Since the permittivity (E3) is higher than the permittivity (E2), when an electronic component is mounted on the printed wiring board, malfunction is unlikely to occur. The permittivity (E2) of the first insulating layer 50 and a permittivity (E4) of the second insulating layer 150 are equal to each other. Or, the permittivity (E4) of the second insulating layer 150 is greater than the permittivity (E2) of the first insulating layer 50.

In the printed wiring board of the embodiment, the ratio (permittivity (E1)/permittivity (E2)) between the permittivity (E1) and the permittivity (E2) is 1.5 or more and 5 or less. Fingerprint authentication can be performed using capacitances. When the ratio (permittivity (E1)/permittivity (E2)) is 2 or more, the repeat accuracy is increased. The measuring time is shortened.

In the printed wiring board of the embodiment, an insulation resistance of the lower side solder resist layer (70S) is higher than an insulation resistance of the upper side solder resist layer (70F). Even when the lower side solder resist layer (70S) has the opening, insulation reliability of the lowermost conductor layer (fourth conductor layer) 358 is high.

In the printed wiring board of the embodiment, the solder resist layers (70F, 70S) and the resin insulating layers (50, 150, 250) each include a resin and particles; and the permittivities (E1, E2, E3, E4) of the solder resist layers (70F, 70S) and the resin insulating layers (50, 150, 250) can be adjusted by kinds and amounts of the particles. A relative permittivity ($\varepsilon r1$) of the particles contained in the upper side solder resist layer (70F) is higher than a relative permittivity ($\varepsilon r2$) of the particles contained in the first insulating layer 50. A ration ($\varepsilon r1/\varepsilon r2$) between the relative permittivity ($\varepsilon r1$) and the relative permittivity ($\varepsilon r2$) is 10 or more. The ratio ($\varepsilon r1/\varepsilon r2$) is 2000 or less. For example, the first insulating layer 50 contains silica particles. For example, the upper side solder resist layer (70F) contains barium titanate particles. For example, the relative permittivity ($\varepsilon r1$) is 5 or more and 1500 or less, and the relative permittivity ($\varepsilon r2$) is 2 or more and 4.8 or less.

The relative permittivity ($\varepsilon r1$) of the particles contained in the upper side solder resist layer (70F) is higher than a relative permittivity ($\varepsilon r3$) of the particles contained in the lower side solder resist layer (70S). A ration ($\varepsilon r1/\varepsilon r3$) between the relative permittivity ($\varepsilon r1$) and the relative permittivity ($\varepsilon r3$) is 10 or more. The ratio ($\varepsilon r1/\varepsilon r3$) is 2000 or less. For example, the lower side solder resist layer (70S) contains silica particles. For example, the upper side solder resist layer (70F) contains barium titanate particles. For example, the relative permittivity ($\varepsilon r1$) is 5 or more and 1500 or less, and the relative permittivity ($\varepsilon r3$) is 2 or more and 4.8 or less.

An amount of the particles contained in the upper side solder resist layer (70F) is larger than an amount of the particles contained in the lower side solder resist layer. The amount of the particles contained in the upper side solder resist layer (70F) is larger than an amount of the particles contained in the insulating layer 50.

In the first example, the second example, and the embodiment, the finger is placed on the upper side solder resist layer (70F). The finger is in contact with the upper side solder resist layer (70F). To protect the upper side solder resist layer (70F), a protective sheet may be laminated on the upper side solder resist layer (70F). In this case, the finger is placed on the protective sheet. The finger is in contact with the protective sheet. Even when the printed wiring board 10 has the protective sheet, fingerprint authentication is performed in the same way as in the first example. Fingerprint authentication is performed in the same way as in the second example.

When a capacitance type fingerprint sensor is incorporated in a device, the capacitance type fingerprint sensor is likely to be mounted on a printed wiring board. In this case, the printed wiring board with the capacitance type fingerprint sensor may become thicker. Since a space is required for mounting the capacitance type fingerprint sensor, the printed wiring board may be increased in size. Further, due to the electrode on the insulating layer, it is likely that an upper surface of the protective film has large unevenness. Due to the unevenness, a distance between a finger and an electrode may be accurately recognized. Therefore, it is likely that a fingerprint cannot be authenticated with high accuracy.

A printed wiring board according to an embodiment of the present invention includes: a second insulating layer that has a third surface and a fourth surface that is on an opposite side of the third surface; a second conductor circuit for fingerprint authentication that is formed on the third surface of the second insulating layer; a first insulating layer that has a first surface and a second surface that is on an opposite side of the first surface, and is formed on the third surface of the second insulating layer and on the second conductor circuit for fingerprint authentication such that the second surface opposes the third surface; a first conductor circuit for fingerprint authentication that is formed on the first surface of the first insulating layer; and an upper side solder resist layer that is formed on the first surface of the first insulating layer and on the first conductor circuit for fingerprint authentication. The first conductor circuit for fingerprint authentication has a top surface of the first conductor circuit that faces the first surface and a bottom surface of the first conductor circuit that is on an opposite side of the top surface of the first conductor circuit. The first conductor circuit for fingerprint authentication is embedded in the first insulating layer such that the top surface of the first conductor circuit is exposed from the first surface. The second conductor circuit for fingerprint authentication has a top surface of the second conductor circuit that faces the third surface and a bottom surface of the second conductor circuit that is on an opposite side of the top surface of the second conductor circuit. The second conductor circuit for fingerprint authentication is embedded in the second insulating layer such that the top surface of the second conductor circuit is exposed from the third surface. The first conductor circuit for fingerprint authentication and the second conductor circuit for fingerprint authentication oppose each other across the first insulating layer. A finger is placed on the upper side solder resist layer.

According to an embodiment of the present invention, a printed wiring board having a function for authenticating a fingerprint, or an application example thereof, is reduced in size.

According to an embodiment of the present invention, a printed wiring board having a function for authenticating a fingerprint, or an application example thereof, is reduced in thickness.

According to an embodiment of the present invention, a fingerprint can be authenticated with high accuracy.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a first insulating layer;
   a first conductor circuit comprising fingerprint authentication circuitry and embedded in the first insulating layer such that the first conductor circuit has an exposed surface exposed and recessed from a surface of the first insulating layer;
   a second insulating layer on which the first insulating layer is formed;
   a second conductor circuit comprising fingerprint authentication circuitry and embedded in the second insulating layer such that the second conductor circuit has an exposed surface exposed from a surface of the second insulating layer and is interposed between the first insulating layer and the second insulating layer; and
   a solder resist layer formed on the surface of the first insulating layer such that the solder resist layer is covering the first conductor circuit and that the solder resist layer has a permittivity that is greater than a permittivity of the first insulating layer,
   wherein the first conductor circuit and the second conductor circuit are positioned such that the first conductor circuit and the second conductor circuit are opposing each other across the first insulating layer and that a finger for fingerprint authentication is placed on the solder resist layer, and each of the solder resist layer and the first insulating layer comprises resin material and particles such that the particles in the solder resist layer have a relative permittivity that is higher than a relative permittivity of the particles in the first insulating layer.

2. A printed wiring board according to claim 1, wherein the solder resist layer does not have an opening.

3. A printed wiring board according to claim 1, wherein the first conductor circuit is embedded in the first insulating layer such that a distance between the exposed surface of the first conductor circuit and the surface of the first insulating layer is set to be 4 μm or less.

4. A printed wiring board according to claim 1, wherein the solder resist layer is formed on the surface of the first insulating layer such that the solder resist layer has an outer surface having a maximum height Rmax of 4 μm or less.

5. A printed wiring board according to claim 1, wherein the solder resist layer is formed on the surface of the first insulating layer such that the solder resist layer has a thickness in a range of 3 μm to 10 μm.

6. A printed wiring board according to claim 2, wherein the first conductor circuit is embedded in the first insulating layer such that a distance between the exposed surface of the first conductor circuit and the surface of the first insulating layer is set to be 4 μm or less.

7. A printed wiring board according to claim 2, wherein the solder resist layer is formed on the surface of the first insulating layer such that the solder resist layer has an outer surface having a maximum height Rmax of 4 μm or less.

8. A printed wiring board according to claim 2, wherein the solder resist layer is formed on the surface of the first insulating layer such that the solder resist layer has a thickness in a range of 3 μm to 10 μm.

9. A printed wiring board according to claim 3, wherein the solder resist layer is formed on the surface of the first insulating layer such that the solder resist layer has an outer surface having a maximum height Rmax of 4 μm or less.

10. A printed wiring board according to claim 3, wherein the solder resist layer is formed on the surface of the first insulating layer such that the solder resist layer has a thickness in a range of 3 μm to 10 μm.

11. A printed wiring board according to claim 4, wherein the solder resist layer is formed on the surface of the first insulating layer such that the solder resist layer has a thickness in a range of 3 μm to 10 μm.

12. A printed wiring board according to claim 6, wherein the solder resist layer is formed on the surface of the first insulating layer such that the solder resist layer has an outer surface having a maximum height Rmax of 4 μm or less.

13. A printed wiring board according to claim 12, wherein the solder resist layer is formed on the surface of the first insulating layer such that the solder resist layer has a thickness in a range of 3 μm to 10 μm.

14. A printed wiring board according to claim 7, wherein the solder resist layer is formed on the surface of the first insulating layer such that the solder resist layer has a thickness in a range of 3 μm to 10 μm.

15. A printed wiring board according to claim 9, wherein the solder resist layer is formed on the surface of the first insulating layer such that the solder resist layer has a thickness in a range of 3 μm to 10 μm.

16. A printed wiring board according to claim 1, wherein the first conductor circuit comprises a plurality of wirings configured to accumulate electric charge corresponding to a capacitance between the first conductor circuit and the finger, and the second conductor circuit comprises a plurality of wirings configured to detect the electric charge accumulated in the first conductor circuit as a voltage.

17. A printed wiring board according to claim 16, wherein the solder resist layer does not have an opening.

18. A printed wiring board according to claim 16, wherein the first conductor circuit is embedded in the first insulating layer such that a distance between the exposed surface of the first conductor circuit and the surface of the first insulating layer is set to be 4 μm or less.

19. A printed wiring board according to claim 1, wherein the solder resist layer and the first insulating layer are formed such that a ratio between the permittivity of the solder resist layer and the permittivity of the first insulating layer is in a range of 1.5 to 5.

20. A printed wiring board according to claim 1, wherein the solder resist layer and the first insulating layer are formed such that a ratio between the relative permittivity of the particles in the solder resist layer and the relative permittivity of the particles in the first insulating layer is in a range of 10 to 2000.

\* \* \* \* \*